United States Patent [19]
Chai et al.

[11] Patent Number: 5,837,662
[45] Date of Patent: Nov. 17, 1998

[54] POST-LAPPING CLEANING PROCESS FOR SILICON WAFERS

[75] Inventors: Jing Chai, St. Charles; Henry F. Erk, St. Louis; Judith Ann Schmidt, St. John; Thomas Eugene Doane, St. Charles, all of Mo.

[73] Assignee: MEMC Electronic Materials, Inc., St. Peters, Mo.

[21] Appl. No.: 990,123

[22] Filed: Dec. 12, 1997

[51] Int. Cl.$^6$ .............. B08B 3/12; C23G 1/02; C23G 1/14; H01L 21/02
[52] U.S. Cl. ............................ 510/175; 134/3
[58] Field of Search .................. 510/175; 134/3

[56] References Cited

U.S. PATENT DOCUMENTS

| | | | |
|---|---|---|---|
| 4,116,714 | 9/1978 | Basi | 134/3 |
| 4,261,791 | 4/1981 | Shwartzman | 156/628 |
| 4,964,919 | 10/1990 | Payne | 134/2 |
| 5,049,200 | 9/1991 | Brunner et al. | 134/2 |
| 5,051,134 | 9/1991 | Schnegg et al. | 134/3 |
| 5,078,801 | 1/1992 | Malik | 134/29 |
| 5,129,955 | 7/1992 | Tanaka | 134/2 |
| 5,176,756 | 1/1993 | Nakashima et al. | 134/2 |
| 5,290,361 | 3/1994 | Hayashida et al. | 134/2 |
| 5,308,400 | 5/1994 | Chen | 134/2 |
| 5,340,437 | 8/1994 | Erk et al. | 156/639 |
| 5,464,480 | 11/1995 | Matthews | 134/1.3 |
| 5,470,393 | 11/1995 | Fukazawa | 134/3 |
| 5,487,398 | 1/1996 | Ohmi et al. | 134/95.1 |
| 5,489,557 | 2/1996 | Jolley | 438/476 |
| 5,498,293 | 3/1996 | Ilardi et al. | 134/3 |
| 5,505,785 | 4/1996 | Ferrell | 134/1 |
| 5,509,970 | 4/1996 | Shiramizu | 134/3 |
| 5,516,730 | 5/1996 | Saeed et al. | 438/473 |
| 5,560,857 | 10/1996 | Sakon et al. | 510/175 |
| 5,580,846 | 12/1996 | Hayashida et al. | 510/175 |
| 5,593,505 | 1/1997 | Erk et al. | 134/1.3 |
| 5,626,681 | 5/1997 | Nakano et al. | 134/3 |
| 5,635,463 | 6/1997 | Muraoka | 510/175 |
| 5,637,151 | 6/1997 | Schulz | 134/2 |
| 5,662,743 | 9/1997 | Nakano et al. | 134/3 |
| 5,662,769 | 9/1997 | Schonauer et al. | 438/633 |
| 5,665,168 | 9/1997 | Nakano et al. | 134/2 |
| 5,704,987 | 1/1998 | Huynh et al. | 134/6 |
| 5,759,971 | 6/1998 | Manako | 510/175 |

Primary Examiner—Robert Kunemund
Assistant Examiner—Donald L. Champagne
Attorney, Agent, or Firm—Senniger, Powers, Leavitt & Roedel

[57] ABSTRACT

A process for cleaning contaminants from the surface of a semiconductor wafer after the wafer has been lapped. The process comprises contacting the wafer with an oxidizing agent to oxidize organic contaminants which may be present on the surface of the wafer. The wafer is then immersed in an aqueous bath comprising citric acid into which sonic energy is being directed to remove metallic contaminants which may be present on the surface of the wafer. After being immersed in the citric acid bath, the wafer is contacted with hydrofluoric acid to remove a layer of silicon dioxide which may be present on the surface of the wafer. The wafer is then immersed in an aqueous bath comprising an alkaline component and a surfactant, and into which sonic energy is being directed.

23 Claims, No Drawings

POST-LAPPING CLEANING PROCESS FOR SILICON WAFERS

BACKGROUND OF THE INVENTION

The process of the present invention relates generally to the cleaning of semiconductor wafers. More particularly, the present invention relates to a sequence of treatment steps for the cleaning of organic residues, metallic impurities and other particulate contaminants which may be present on the surface of lapped single crystal silicon wafers.

Semiconductor wafers used in the fabrication of integrated circuits are produced by slicing thin wafers from a single crystal silicon ingot. After slicing, the wafers undergo a lapping process to give them a somewhat uniform thickness. The wafers are then etched to remove damage and produce a smooth surface. The final step in a conventional semiconductor wafer shaping process is a polishing step to produce a highly reflective and damage-free surface on at least one face of the wafer. It is upon this polished face that integrated circuit fabrication takes place.

The wafers must be cleaned between the lapping and etching steps in order to remove such things as lapping grit (e.g., alumina) and organic residues, as well as metallic contaminants and other types of particulate impurities. If the cleaning process is not effective, the surfaces of the wafer will be contaminated, or "stained," with these impurities. Additionally, some of these contaminants may transfer from one side of the wafer to the other, such as from the unpolished side of the wafer to the polished side. If integrated circuits are fabricated on a wafer surface stained with these impurities, the quality and performance of these circuits may be greatly diminished. Therefore, the wafers are typically inspected for stains, which indicate the presence of these contaminants, by visually examining the wafers while under either bright light or fluorescent light illumination.

Cleaning of lapped silicon wafers is generally done in ultrasonic tanks using caustic solutions with or without a surfactant to assist in wetting and dispensing dirt. There are, however, several disadvantages to this method. First, the total processing time to produce sufficiently clean wafers may be thirty or more minutes. Such prolonged exposure to ultrasonics can cause damage to the crystal lattices of the wafers. Second, the application of ultrasonic energy to the cleaning tanks results in the formation of standing waves. Consequently, the silicon wafers are exposed to nonuniform energy and are not sufficiently cleaned. Third, after lapping and upon being exposed to an oxygen-containing ambient, a "native" oxide layer grows on the just-lapped wafer surface. This oxide layer acts to trap metallic particles, lapping grit, and other impurities. If this oxide layer is not removed prior to cleaning, the trapped impurities will also not be effectively removed.

Numerous processes have heretofore been proposed for reducing or removing the fine particulate which adhere to the surfaces of the silicon wafer. (See, e.g., U.S. Pat. No. 5,489,557 (Jolley); U.S. Pat. No. 5,635,463 (Muraoka); U.S. Pat. No. 5,049,200 (Brunner et al.); U.S. Pat. No. 5,308,400 (Chen); 5,129,955 (Tanaka); U.S. Pat. No. 4,261,791 (Shwartzman); U.S. Pat. No. 5,498,293 (Ilardi et al.); and, Japanese Pat. No. H09-007991 (Kitamura et al.)) In general, however, these processes are not preferred because they fail to remove contaminants in an amount which is sufficient to prevent a reduction in integrated circuit performance and quality from occurring.

In view of the forgoing, a need continues to exist for a process which produces a substantially contaminant-free silicon wafer by efficiently removing metals, lapping grit, organic residues, and other particulate impurities by the application of sonic energy, without causing damage to the crystal lattice of the wafer.

SUMMARY OF THE INVENTION

Among the objects of the present invention may be noted the provision of an improved process for cleaning the surface of a semiconductor wafer; the provision of such a process which provides a wafer surface suitable for integrated circuit fabrication; the provision of such a process which effectively removes lapping grit, organic residues and other particulate impurities from the wafer surface; and, the provision of such a process which maximizes the effectiveness of ultrasonics in the cleaning process without causing damage to the crystal lattice of the wafer.

Generally, the present invention is directed to a process for cleaning contaminants from the surface of a semiconductor wafer after the wafer has been lapped. The process comprises contacting the wafer with an oxidizing agent to oxidize organic contaminants which may be present on the wafer surface. After treatment with the oxidizing agent, the wafer is immersed in an aqueous bath comprising citric acid, into which sonic energy is being directed, in order to remove metallic contaminants which may be present on the surface of the wafer. The wafer is subsequently contacted with hydrofluoric acid to remove a layer of silicon dioxide which may be present on the surface of the wafer, and then it is immersed in an aqueous bath into which sonic energy is directed, the bath comprising an alkaline component and a surfactant.

The present invention is further directed to such a cleaning process wherein multiple wafers may be cleaned at one time using a wafer carrier in order to increase throughput. When a wafer carrier is used, the carrier is rinsed with water after treatment with hydrofluoric acid and before being immersed in the aqueous alkaline bath.

Other objects and features will be in part apparent and in part pointed out hereinafter.

DETAILED DESCRIPTION OF THE PREFERRED EMBODIMENTS

After a silicon wafer undergoes a lapping process, lapping slurry remains on the wafer surface. Among other things, this lapping slurry contains lapping grit and suspending or binding compounds which are organic in nature and which trap particulate impurities, such as alumina, to the surface of the wafer. In accordance with the process of the present invention, these and other particulate impurities which may be present are removed by first contacting, or treating, the lapped silicon wafer with either a gaseous or a liquid oxidizing agent. Examples of suitable oxidizing agents include ozone, SC-1 (a solution comprising ammonium hydroxide, hydrogen peroxide, and water in a 1:1:5 ratio), piranha bath, sulfuric acid with ozone, and aqua regia.

The oxidizing agent reacts with, or oxidizes, the suspending or binding compounds, as well as a number of other organic impurities present on the wafer surface. The oxidation of these compounds acts to breakdown the carbon bonds within them, resulting in their decomposition into carbon dioxide and water. The oxidation therefore allows for impurities such as alumina to be readily removed because they are no longer bound by these compounds to the silicon wafer surface.

In a preferred embodiment, the semiconductor wafer is immersed in an oxidizing bath comprising ozonated water.

The concentration of ozone in solution typically ranges from about 5 to about 50 ppm. Preferably, the concentration ranges from about 10 to about 20 ppm and, more preferably, from about 14 to about 16 ppm. Typically, the temperature of the bath is below ambient temperature. Preferably, however, the temperature ranges from about 0° C. to about 25° C. and, more preferably, from about 10° C. to about 150° C. The residence time of the wafer within the oxidizing bath typically ranges from about 10 seconds to about 120 seconds, and preferably ranges from about 20 seconds to 45 seconds. More preferably, the residence time of the wafer within the oxidizing bath ranges from about 25 seconds to about 35 seconds.

After being treated with the oxidizing agent, the semiconductor wafer is immersed in an aqueous bath comprising citric acid. The concentration of citric acid in the bath preferably ranges from about 1 to about 5 percent by weight, and more preferably ranges from about 2 to about 3 percent by weight. The pH of the citric acid bath typically ranges from about 1 to about 3. Preferably, however, the pH ranges from about 2.2 to about 2.5. The temperature of the citric acid bath typically ranges from about 50° C. to about 70° C., and preferably from about 55° C. to about 65° C. The residence time of the wafer within the bath is typically at least about 4 minutes. Preferably, however, the wafer will be immersed in the bath for about 4.5 to about 6 minutes.

The citric acid serves as a complexing agent and acts to trap metal ions, particularly aluminum, iron and titanium, which are present on the surface of the wafer and in the bath itself. Once these complexes are formed, the citric acid further acts to flocculate the particles into larger structures. In this way, fine particulate may be transformed into larger particles which are more readily filtered and removed. As a result, the citric acid bath acts to limit the likelihood that lapping grit and other particulate impurities will be redeposited on the wafer surface after having been removed.

Following treatment with the citric acid bath, a layer of silicon dioxide is typically present on the wafer surface. This layer, or film, may be in part native and in part the result of wafer treatment in an oxidizing bath. Various particles, such as lapping grit and trace metallic impurities not stripped by the citric acid bath, are often incorporated within this film and thus act to contaminate the wafer surface. Preferably, therefore, the oxide film is removed from the wafer surface by contacting the wafer with hydrofluoric acid.

While the hydrofluoric acid step may be carried out by exposing the wafer to a hydrofluoric acid vapor (see, e.g., Prigge et al., U.S. Pat. No. 4,973,563), it is preferred that the wafer be immersed in an aqueous bath comprising hydrofluoric acid. Preferably, the concentration of the hydrofluoric acid in the bath ranges from about 1 to about 50 percent by volume, and more preferably from about 1 to about 5 percent by volume.

Furthermore, the temperature of the hydrofluoric acid bath preferably ranges from about 20° C. to about 80° C., and more preferably from about 20° C. to about 60° C. The residence time of the wafer within the hydrofluoric acid bath is at least about 30 seconds. Preferably, however, the wafer will reside within the bath for about 1 to about 15 minutes, and more preferably for about 4 minutes to about 5 minutes.

After being treated with hydrofluoric acid, the semiconductor wafer is immersed in an aqueous bath comprising an alkaline component and a surfactant. The temperature of the alkaline bath is preferably about 50° C. to about 70° C., and more preferably about 55° C. to about 65° C. The residence time of the wafer within the alkaline bath is about 4 minutes to about 30 minutes, more preferably about 6 minutes to about 20 minutes, and most preferably about 8 minutes to about 10 minutes.

Suitable alkaline components include a SC-1 solution, as well as any alkali cleaning medium, including a solution containing either potassium hydroxide, sodium hydroxide, lithium hydroxide, potassium carbonate, sodium carbonate, or any of the corresponding bicarbonates, as well as any alkaline phosphate. Any of these alkaline solutions may be used in combination with surfactants that are commonly known in the art to be suitable for use as a wafer cleaning agent under alkaline conditions.

In a preferred embodiment, the alkaline bath comprises potassium hydroxide at a concentration typically ranging from about 1 to about 5 percent by volume of the bath, and preferably ranging from about 2 to about 4 percent by volume. The alkaline bath also comprises a surfactant which is preferably a commercially available detergent, such as Vector HTC (available from Intersurface Dynamics of Bethel, Conn.). Preferably, the concentration of the surfactant in the bath ranges from about 1 to about 5 percent by volume, and more preferably from about 2 to about 4 percent by volume.

The alkaline bath aids in the cleaning process by changing the surface potential of the silicon wafer, thus causing the surface of the wafer to electrostatically repel silica and other particulate impurities which may be present. It is to be noted in this regard that the previous steps in the present process, particularly the hydrofluoric acid step, resulted in the wafer having a surface potential. By treating the wafer with an alkaline bath, the surface potential is changed. As a result, particles that were previously attracted to the wafer surface are now electrostatically repelled and can thus be more easily removed from the wafer surface.

To increase the throughput of a system incorporating the process of the present invention, the alkaline bath step can be divided into two separate steps. In this embodiment, instead of using a single alkaline bath in which the wafer most preferably resides for about 8 to about 10 minutes, the wafer is placed in each of two separate alkaline baths, successively. The wafer resides in each bath for about 4 minutes to about 5 minutes.

After treatment with the alkaline bath, or baths, the wafer is preferably rinsed with water by fully immersing it in a water bath. The temperature of the water bath is typically about 20° C. to about 65° C., and preferably about 45° C. to about 55° C. The residence time of the wafer within the water bath is typically about 2 to about 5 minutes, and preferably about 3 to about 4 minutes. During the time the wafer resides in the water bath, water is continuously removed and replaced with fresh water. In this way the entire volume of the bath is preferably removed and replaced about 1 to about 2 times while the wafer is being rinsed.

Once rinsing of the wafer is complete, the wafer is preferably treated again with an oxidizing agent in the same manner in which the first oxidation treatment was performed. This step acts to oxidize any remaining organic residues, such as those resulting from surfactants not removed by the water rinse. This step also promotes the growth of an oxide layer on the surface of the wafer which acts to protect the wafer from contamination by passivating the wafer surface. Passivation is necessary because, without an oxide layer, there exists an active charge on the surface of the wafer. This active charge can attract oppositely charged particles and result in the surface becoming recontaminated. By passivating the surface charge, this attraction may be eliminated.

Once the silicon wafer has been cleaned in accordance with the process of the present invention, it may be dried by conventional means as necessary for additional processing.

It is to be noted that, in a preferred embodiment of the present invention, throughput is increased by processing multiple wafers at one time. This is achieved by inserting wafers into a wafer carrier, or cassette, which acts to secure the wafers while they are immersed in the baths and transferred between the baths. The wafer carrier is typically a conventional cassette, such as a model X4200-01 cassette which is commercially available from Empak of Colorado Springs, Colo. However, if a wafer carrier is used, the carrier is preferably rinsed with deionized ("DI") water after the hydrofluoric acid treatment step is complete and before the carrier is immersed in the aqueous alkaline bath. This rinsing step acts to remove any residual hydrofluoric acid from the wafer carrier. Failure to rinse the wafer carrier after the hydrofluoric acid step can result in the contamination of subsequent baths. It is to be noted that the wafer itself need not be rinsed because it is hydrophobic at this point in the process and, as such, would be unaffected by a water rinse.

The rinsing time is preferably minimized to prevent reformation of an oxide layer on the surface of the wafer. Therefore, it is preferred that this rinsing step last for less than about 10 minutes, more preferably for about 10 to about 30 seconds, and most preferably about 15 to about 20 seconds. Typically, the water rinse will be at ambient temperature.

It is to be further noted that, also in a preferred embodiment of the present invention, the cleaning action of the citric acid bath and the alkaline bath may be enhanced by the application of sonic energy. An ultrasonic generator, such as the Ney Sweepsonic™ (available from Ney Corporation of Bloomfield, Conn.), is typically used to direct ultrasonic energy through the baths. It is to be noted in this regard that frequency is controlled by the ultrasonic generator being employed. As a result, the frequency used may vary as the model and supplier of the ultrasonic generator varies. Preferably, however, the frequency of the ultrasonic energy generated and directed through the particular bath will range from about 40 to about 120 kHz. In addition, the ultrasonic power density provided by the ultrasonic generator will typically range from about 20 watts per liter to about 60 watts per liter of solution in the bath, and preferably from about 25 watts to about 30 watts per liter.

The ultrasonic energy aids in removing particulate contaminants that become trapped in crevices on the wafer surface. Without being held to any particular theory, it is believed that the importance of this mechanical action derives from the fact that cavitation bubbles, generated by the ultrasonic wave, break at the surface of the wafer, causing a scrubbing action on the surface of the wafer. In addition, as previously noted, the introduction of cleaning solutions with different pH values leads to a change in the charge of particles on the surface of the wafer. This change in charge helps "loosen" the particulate by weakening the attractive forces between the particulate and the wafer surface. After the particles have been so loosened, the mechanical action of the ultrasonic agitation acts to remove the particles from the wafer surface and into the cleaning solution.

Increased removal of contamination from the wafer surface is preferably achieved, when the wafer is immersed in a solution, by employing the process for cleaning a wafer as disclosed by U.S. Pat. No. 5,593,505 (Erk et al.). In this process, a gas-liquid interface is defined at the surface of the aqueous solution being employed. The wafer is placed in the bath so that it is oriented in a generally upright position with at least part of the wafer in the liquid and below the gas-liquid interface. Sonic energy is then directed through the liquid. The wafer is simultaneously rotated in a reciprocating motion relative to the bath so that the entire surface of the wafer is repeatedly passed through the gas-liquid interface of the bath. The wafer can also be rotated as the level of the liquid in the bath is raised and lowered. This also results in the surface of the wafer being repeatedly passed through the gas-liquid interface. Finally, as yet another alternative, the wafer can be repeatedly immersed completely in the bath and then removed completely from the bath. The wafer is continuously rotated while the successive immersions occur. Again, this results in the surface of the wafer being repeatedly passed through the gas-liquid interface.

In all cases, at least a portion of the wafer is repeatedly passed through the gas-liquid interface.

For all of the above-described cleaning baths, it is preferred that the baths be continuously filtered and recirculated. This feature aids in the removal of impurities from the solution and helps prevent impurities from being redeposited on the wafer surface. Preferably, the recirculation system has a capacity of one bath turnover about every 2 minutes. It is also preferred that the above-described baths be agitated, further aiding in the removal of impurities from the surface of the wafer. This agitation is particularly preferred when a wafer cassette is employed in order to aid in the cleaning of the wafer surface at or near the edge, which is in contact with the wafer cassette.

The present invention is illustrated by the following example which is merely for the purpose of illustration and is not to be regarded as limiting the scope of the invention or manner in which it may be practiced.

EXAMPLE

In accordance with the process of the present invention, multiple lapped single crystal silicon wafers were cleaned at one time by placing them in a wafer cassette and first immersing the cassette in a bath containing ozonated water for about 30 seconds. The concentration of the ozone in the bath was about 15 ppm and the bath had a temperature of about 20° C.

The wafers were removed from the ozonated water bath and then partially immersed in a bath containing citric acid, through which sonic energy was being directed at a frequency of about 40 kHz. The bath was heated to a temperature of about 60° C., had a pH of about 2, and a citric acid concentration of about 3 percent by weight. The wafers were allowed to reside in the citric acid bath for about 4 and a half minutes, during which the wafers were rotated such that at least a portion of each wafer is repeatedly passed through the bath and below the gas-liquid interface.

The wafers were then removed from the citric acid bath and immersed in a bath containing hydrofluoric acid. The concentration of the hydrofluoric acid in the bath was about 2 percent by volume. The wafers were allowed to reside in the hydrofluoric acid bath, which was heated to a temperature of about 60° C., for about 5 minutes.

The wafers were removed from the hydrofluoric acid bath and then the wafer carrier was rinsed with deionized water at ambient temperature for about 20 seconds, in order to remove any residual hydrofluoric acid present. Following this rinse, the wafers were partially immersed in a first aqueous alkaline bath, through which sonic energy was directed at a frequency of about 40 kHz. The aqueous alkaline bath had a potassium hydroxide concentration of about 2 percent by volume, while the concentration of Vector HTC surfactant was also about 2 percent by volume. The wafers were allowed to reside in this first alkaline bath, which had been heated to a temperature of about 60° C., for about 5 minutes, during which the wafers were rotated such that at least a portion of each wafer was repeatedly passed through the bath and below the gas-liquid interface.

Following the multiple bath technique, the wafers were then removed from the first aqueous alkaline bath and partially immersed in a second bath having the same composition as the first. The second bath was also heated to about 60° C., and the residence time for the wafers in this bath was also about 5 minutes. Again, while immersed in the solution, the wafers were rotated such that at least a portion of each wafer repeatedly passed through the bath and below the gas-liquid interface.

The wafers were then removed from the second aqueous alkaline bath and immersed in a bath containing deionized water. The wafers were allowed to reside in the water bath, which had been heated to about 55° C., for about 3 minutes.

Finally, the wafers were removed from the water bath and oxide layers were grown on the surfaces of the wafers by immersing them in a bath containing ozonated water. The composition of this bath was the same as the first oxidizing bath, having a concentration of ozone of about 15 ppm. The bath was about 20° C. and the wafers were allowed to reside in this bath only about 30 seconds.

After being removed from the oxidizing bath, the wafers were dried by conventional means standard to the art.

In total, about 900 wafers were cleaned by the above process. The wafers were examined visually under bright light illumination for the presence of any stains on the surface of the wafers, which indicate the presence of impurities. Results indicate that less than about 1% of the wafers which were cleaned in accordance with the present process showed evidence of unacceptable surface stains. By comparison, it is to be noted that experimental evidence to-date indicates that typically about 5 to about 10 percent of the wafers cleaned by conventional processes will be unacceptably stained.

In addition to examining the wafers visually for the presence of stains, the wafers that were cleaned by the present process were also analyzed to determine the surface concentration of metallic contaminants. These results were then compared to lapped wafers which had been cleaned by two conventional methods. The first method (commercially available from Sonic Systems, Inc., in Newtown, Pa.) involves fully immersing the wafer sequentially in (i) a citric acid solution, (ii) a solution of potassium hydroxide and a surfactant, and (iii) a rinse solution of deionized water.

The second method (commercially available from Wafer Process Systems Inc., located in San Jose, Calif.) was modified slightly by using the process as disclosed by Erk et al. in U.S. Pat. No. 5,593,505. This modified method involves, sequentially, (i) fully immersing the wafer in a citric acid solution, (ii) immersing only half of the wafer in a solution of potassium hydroxide and a surfactant, and then rotating the wafer per the process as disclosed by Erk et al., and (iii) rinsing the wafer with deionized water. For both methods, sonic energy was directed through the citric acid and potassium hydroxide baths, both at a frequency of about 40 kHz, and the wafers were conventionally dried.

Approximately 900 wafers were prepared by each of the above-referenced methods. These wafers, as well as an equal number of wafers prepared in accordance with the process of the invention as embodied in the present example, were then analyzed by means of ICP/MS, which is conventional in the art, in order to determine the surface concentration of metallic contaminants. The following table illustrates the average concentration of surface metal contaminants found on these wafers.

| Cleaning Process | CONTAMINANT ($10^{10}$ atoms/cm$^2$) | | |
|---|---|---|---|
| | Al | Fe | Ti |
| Sonic Systems | 4429 | 71 | 165 |
| Modified Wafer Process Systems | 1735 | 31 | 54 |
| Present Invention | 4.32 | 1.8 | 0.7 |

As can be seen from the above results, the process of the present invention affords the means by which to obtain a significant reduction in the surface concentration of aluminum (Al), iron (Fe) and titanium (Ti). These metals are of primary concern because they are the most common of the metallic contaminants which result from standard wafer lapping processes. Aluminum and titanium contamination originates from the lapping grit, while iron contamination originates from the lapping plate.

In view of the above, it will be seen that the several objects of the invention are achieved and other advantageous results attained. It is intended that all matter contained in the above description shall be interpreted as illustrative and not in a limiting sense.

What is claimed is:

1. A process for cleaning contaminants from the surface of a semiconductor wafer after the semiconductor wafer has been lapped, the process comprising:
    (a) contacting the lapped wafer with an oxidizing agent to oxidize organic contaminants which may be present on the surface of the wafer;
    (b) after step (a), immersing the wafer in an aqueous bath comprising citric acid into which sonic energy is being directed to remove metallic contaminants which may be present on the surface of the wafer;
    (c) after step (b), contacting the wafer with hydrofluoric acid to remove a layer of silicon dioxide which may be present on the surface of the wafer; and,
    (d) after step (c), immersing the wafer in an aqueous bath into which sonic energy is being directed, the bath comprising an alkaline component and a surfactant.

2. The process as set forth in claim 1 wherein the lapped wafer is contacted with an oxidizing agent in step (a) by immersing the wafer in an aqueous bath comprising an oxidizing agent.

3. The process as set forth in claim 2 wherein the oxidizing agent is ozonated water.

4. The process as set forth in claim 3 wherein the aqueous bath has an ozone concentration ranging from about 10 to about 20 ppm.

5. The process as set forth in claim 3 wherein the wafer is immersed in the aqueous bath for about 25 to about 35 seconds.

6. The process as set forth in claim 1 wherein the aqueous bath of step (b) has a citric acid concentration ranging from about 2 to about 3 percent by weight of the bath.

7. The process as set forth in claim 1 wherein the aqueous bath of step (b) has a pH ranging from about 2.2 to about 2.5.

8. The process as set forth in claim 1 wherein the wafer is immersed in the aqueous bath of step (b) for about 4.5 to about 6 minutes.

9. The process as set forth in claim 1 wherein the wafer is immersed in an aqueous bath comprising hydrofluoric acid in step (c).

10. The process as set forth in claim 9 wherein the bath of step (c) has a hydrofluoric acid concentration ranging from about 1 percent to about 5 percent by volume of the bath.

11. The process as set forth in claim 1 wherein in each of steps (b) and (d) the wafer is rotated such that at least a portion of the wafer repeatedly passes through a gas-liquid interface of the bath.

12. The process as set forth in claim 1 wherein a wafer carrier is used to clean multiple wafers at one time, and wherein between steps (c) and (d) the wafer carrier is rinsed with deionized water to remove hydrofluoric acid which may be present.

13. The process as set forth in claim 1 wherein the aqueous bath of step (d) comprising potassium hydroxide and a surfactant.

14. The process as set forth in claim 13 wherein the aqueous bath of step (d) has a potassium hydroxide concentration ranging from about 2 percent to about 4 percent by volume of the bath.

15. The process as set forth in claim 1 wherein after step (d), the process further comprises:

(e) immersing the wafer in a bath containing deionized water; and, (f) after step (e), immersing the semiconductor wafer in an aqueous bath comprising an oxidizing agent in order to form a layer of silicon dioxide on the wafer surface.

16. The process as set forth in claim 15 wherein a wafer carrier is used to clean multiple wafers at one time, and wherein between steps (c) and (d) the wafer carrier is rinsed with deionized water to remove hydrofluoric acid which may be present.

17. The process as set forth in claim 15 wherein in step (e) the wafer is immersed in a bath containing deionized water for about 2 to about 4 minutes.

18. The process as set forth in claim 15 wherein in step (e) the bath is heated to a temperature of about 20° C. to about 65° C.

19. The process as set forth in claim 15 wherein in step (f) the oxidizing agent is ozone, the bath having an ozone concentration ranging from about 10 to about 20 ppm.

20. The process as set forth in claim 15 wherein in step (f) the wafer is immersed for at least about 30 seconds.

21. The process as set forth in claim 15 wherein in step (f) the bath is heated to a temperature of about 15° C. to about 25° C.

22. A process for cleaning contaminants from the surface of a semiconductor wafer after the semiconductor wafer has been lapped, the process comprising:

(a) immersing the wafer in an aqueous bath comprising ozone, the concentration of ozone in the bath being about 10 ppm to about 20 ppm, the wafer residing in the bath for about 20 seconds to about 45 seconds, the bath having a temperature of about 10° C. to about 15° C.;

(b) after step (a), immersing the wafer in an aqueous bath comprising citric acid into which sonic energy is being directed to remove metallic contaminants which may be present on the surface of the wafer, the wafer residing in the bath for about 4.5 to about 6 minutes, the bath having a temperature of about 55° C. to about 65° C., the concentration of the citric acid in the bath being about 2 percent to about 3 percent by weight;

(c) after step (b), immersing the wafer in an aqueous bath comprising hydrofluoric acid, the wafer residing in the bath for about 1 minute to about minutes, the bath having a temperature of about 20° C. to about 60° C., the concentration of the hydrofluoric acid being about 1 percent to about 5 percent by volume;

(d) after step (c), immersing the wafer in an aqueous bath into which sonic energy is being directed, the bath comprising potassium hydroxide and a surfactant, the wafer residing in the bath for about 6 minutes to about 20 minutes, the bath having a temperature of about 55° C. to about 65° C., the concentration of potassium hydroxide being about 2 percent to about 4 percent by volume and the concentration of a surfactant being about 2 percent to about 4 percent by volume;

(e) after step (d), immersing the wafer in a bath containing DI water for about 3 minutes to about 4 minutes, the bath having a temperature of about 45° C. to about 55° C.;

(f) after step (e), immersing the wafer in an aqueous bath comprising ozone, the concentration of ozone in the bath being about 10 ppm to about 20 ppm, the wafer residing in the bath for about 20 seconds to about 45 seconds, the bath having a temperature of about 10° C. to about 15° C.

23. The process as set forth in claim 22 wherein a wafer carrier is used to clean multiple wafers at one time, and wherein between steps (c) and (d) the wafer carrier is rinsed with deionized water to remove hydrofluoric acid which may be present.

* * * * *

UNITED STATES PATENT AND TRADEMARK OFFICE
CERTIFICATE OF CORRECTION

PATENT NO. : 5,837,662  
DATED : November 17, 1998  
INVENTOR(S) : Jing Chai, Henry F. Erk, Judith Ann Schmidt, Thomas Eugene Doane Page 1 of 1

It is certified that error appears in the above-identified patent and that said Letters Patent is hereby corrected as shown below:

Column 10, claim 22,
Line 19, "to about minutes," should read -- to about 15 minutes, --.

Signed and Sealed this

Twenty-ninth Day of January, 2002

Attest:

Attesting Officer

JAMES E. ROGAN  
Director of the United States Patent and Trademark Office